US008516432B2

(12) United States Patent
Liu et al.

(10) Patent No.: US 8,516,432 B2
(45) Date of Patent: Aug. 20, 2013

(54) METHOD AND DEVICE FOR RECONSTRUCTING SCAN CHAIN BASED ON BIDIRECTIONAL PREFERENCE SELECTION IN PHYSICAL DESIGN

(75) Inventors: Bang Liu, Shanghai (CN); Bohai Liu, Shanghai (CN)

(73) Assignee: Synopsys (Shanghai) Co., Ltd., Shanghai (CN)

( * ) Notice: Subject to any disclaimer, the term of this patent is extended or adjusted under 35 U.S.C. 154(b) by 0 days.

(21) Appl. No.: 13/503,613

(22) PCT Filed: Oct. 27, 2010

(86) PCT No.: PCT/IB2010/002750
§ 371 (c)(1),
(2), (4) Date: Apr. 23, 2012

(87) PCT Pub. No.: WO2011/051788
PCT Pub. Date: May 5, 2011

(65) Prior Publication Data
US 2012/0210290 A1 Aug. 16, 2012

(30) Foreign Application Priority Data
Oct. 30, 2009 (CN) .......................... 2009 1 0211389

(51) Int. Cl.
*G06F 11/22* (2006.01)
*G06F 17/50* (2006.01)
(52) U.S. Cl.
USPC ........... 716/136; 716/106; 716/111; 716/112; 714/724; 714/725; 714/726; 714/727
(58) Field of Classification Search
USPC .......... 716/136, 106, 111, 112; 714/724–727
See application file for complete search history.

(56) References Cited

U.S. PATENT DOCUMENTS

| 6,199,183 | B1 * | 3/2001 | Nadaoka ....................... 714/726 |
| 6,415,404 | B1 * | 7/2002 | Asou ............................ 714/726 |
| 6,681,356 | B1 * | 1/2004 | Gerowitz et al. ............. 714/729 |
| 6,990,642 | B2 * | 1/2006 | Arakawa ........................ 716/103 |
| 7,162,707 | B2 * | 1/2007 | Kanaoka et al. .............. 716/113 |

(Continued)

OTHER PUBLICATIONS

Notification of Transmittal, dated May 10, 2012, of Translation of the International Preliminary Report on Patentability and the Written Opinion of the International Searching Authority from the corresponding International Application No. PCT/IB2010/002750.

(Continued)

*Primary Examiner* — Nha Nguyen
(74) *Attorney, Agent, or Firm* — Young, Basile, Hanlon & MacFarlane, P.C.

(57) ABSTRACT

Reconstruction methods and devices are disclosed for scan chains in physical design that is based on two-way priority selection. The structural reconstruction method in the scan chains, in the first place, establishes a first preference sequence for a certain number of scanning elements in each of these scan chains as well as a secondary preference sequence for these scan chains in each of these scanning elements respectively. Then, two-way selection is executed between the scan chains and scanning elements based on the corresponding first preference sequence and secondary preference sequence, so that these scanning elements can be redistributed to these scan chains. The structural reconstruction method and device in the invention conduct an integrated optimization for a global scan chain, where the global wiring length is shortened dramatically and the wiring efficiency is improved.

23 Claims, 6 Drawing Sheets

(56) References Cited

U.S. PATENT DOCUMENTS

| | | | |
|---|---|---|---|
| 7,987,400 B2* | 7/2011 | Berry et al. | 714/726 |
| 2003/0037296 A1* | 2/2003 | Yoshimoto | 714/726 |
| 2003/0106036 A1* | 6/2003 | Aoki | 716/13 |
| 2003/0182604 A1* | 9/2003 | Hathaway et al. | 714/715 |
| 2005/0235182 A1 | 10/2005 | Lee et al. | |
| 2006/0282727 A1* | 12/2006 | Hoshaku | 714/726 |
| 2009/0049353 A1* | 2/2009 | Erle et al. | 714/729 |
| 2009/0288045 A1* | 11/2009 | Chien et al. | 716/3 |

OTHER PUBLICATIONS

Kobayashi, Susumu et al.; "A VLSI Scan-Chain Optimization Algorithm for Multiple Scan-Paths", IEICE Trans. Fundamentals, vol. E82-A, No. 11, Nov. 1999, pp. 2499-2504.

\* cited by examiner

METHOD AND DEVICE FOR RECONSTRUCTING SCAN CHAIN BASED ON BIDIRECTIONAL PREFERENCE SELECTION IN PHYSICAL DESIGN

TECHNICAL FIELD

This invention involves a structural reconstruction method and device for scan chains, especially for those in physical design of chips based on two-way preference selection.

BACKGROUND

Considering the testability of chips, the overwhelming majority of chips is now set up with scan chains for testing. Since the scan chains are inserted during logic design of chips, and no physical information is included in the insertion, the scan chains in the phase of physical design consequently occupy too many wiring resources and cause wiring congestion or even inability in the wiring. Therefore, it is strictly necessary to structurally optimize the scan chains in the phase of physical design to minimize the wiring resources they may occupy. However, some existing structural optimizations for scan chains focus only on the optimization of one part or a single index, such as time optimization; and these optimal methods are too rough to produce an ideal effect. For instance, they take into account only a lengthwise position or horizontal position of the scanning elements, while excluding the starting and end positions of the scan chains. In addition, a few optimizations in the industry have given global consideration to scanning elements and the positions of scan chains, but they have defects with regard to either optimization efficiency or optimization time.

Thus, to obtain a more effective structural optimization for scan chains has long been a concern in the industry.

SUMMARY

This invention provides a reconstruction method and device for scan chains in physical design based on two-way preference selection. During the physical design period, a reconstruction optimization is made to the global structure of the scan chains and the waste of wiring resources caused by the illogical structure of the scan chains is eliminated while the ability to conduct testing can be guaranteed.

The invention provides a structural reconstruction method for scan chains. A certain number of reconstructed scan chains contains a certain number of scanning elements. The reconstruction method and device for scan chains include: Step One, respectively set up a first preference sequence for certain scanning elements in each of certain scan chains; Step Two, respectively set up a secondary preference sequence for certain scan chains in each of the certain scanning elements; Step Three, execute two-way selection between the scanning chains and scanning elements based on the corresponding first preference sequence and the secondary preference sequence, so that a certain number of scanning elements can be redistributed to a certain number of scan chains.

Meanwhile, the first preference sequence of each of these scan chains is set up with the sum of the distances from each of these scanning elements to the starting and ending points of the scan chain and an arrangement order from small to large. The second preference sequence of each of these scanning elements is set up in accordance with the sum of the distances from the scanning element to the starting point and ending point of each of these scan chains plus the distances between the starting and ending points of correspondent scan chains and arranged in an order from small to large. Step Three further involves: Step I: select one available scanning element from one set of available scanning elements; Step II: in accordance with the second preference sequence of the available scanning element, locate the scan chain with top priority of preference; Step III: Step a: determine whether the scan chain has undergone full distribution or not; if not, execute Step b: distribute the scanning element to the scan chain, and remove it from the set of available scanning elements; otherwise, go to Step c: based on the first preference sequence of the scan chain, determine whether there is a scanning element in the scan chain with a preference priority lower than that of the scanning element. Step c further involves: if yes, go to Step c1: remove the scanning element with the lowest preference priority from the scan chain and add it to the set of available scanning elements; in the meantime, distribute the scanning element to the scan chain; if not, go to Step c2: based on the second preference sequence of the scanning element, select one scan chain with a preference priority lower than that of the scan chain, and return to Step a. In addition, Step III further involves Step d to be executed after Step b or Step c1: check whether the set of scanning elements is null or not; if yes, the reconstruction of these scan chains ends; otherwise, return to Step I.

In another embodiment, Step Three further involves: Step I: select one scan chain to be reconstructed from the set of to-be-reconstructed scan chains; Step II: in accordance with the first preference sequence of the scan chain to be reconstructed, select the scanning element with top priority of preference; Step III: in Step a: check whether the scanning element has been used or not: if not used, go to Step b: distribute the scanning element to the scan chain, and remove it from the set of available scanning elements; otherwise, go to Step c: in accordance with the second preference sequence of the scanning element, check whether the scan chain where the scanning element is located possesses a preference priority higher than that of the scan chain to be reconstructed. Step c further involves: if the scan chain where the scanning element is located possesses a lower preference priority, go to Step c1: the scanning element will be removed from the scan chain where it is located and distributed to the scan chain to be reconstructed, and the original scan chain is added to the set of the to-be-reconstructed scan chains. If the scan chain where the scanning element is located possesses a higher preference priority, go to Step c2: in accordance with the first preference sequence of the scan chain to be reconstructed, locate a scanning element with a preference priority lower than the scanning element, and then return to Step a. In addition, Step III further involves Step d to be executed after Step b or Step c1: determine whether the scan chain has completed the reconstruction or not; if it has, go to Step e and check whether the set of to-be-reconstructed scan chains is null or not; otherwise return to Step II. Step e further involves: if the set of to-be-reconstructed scan chains is null, the reconstruction of all scan chains ends; otherwise, return to Step I.

This invention also provides a structural reconstruction device for scan chains that involves: a constructor of the first preference sequence, to respectively set up the first preference sequence for certain scanning elements in each of certain scanning chains; a constructor of the second preference sequence, to respectively set up the secondary preference sequence for certain scan chains in each of the certain scanning elements; a two-way selection distributor: to enable two-way selections between these scan chains and scanning elements based on the corresponding first preference sequence and second preference sequence, so that these scanning elements can be redistributed to the scan chains.

The two-way selection distributor further involves: one selector, one manager for scanning elements, and one manager for scan chains; the selector selects one available scanning element from one set of available scanning elements in the manager for scanning elements; the constructor of the second preference sequence locates the scan chain with top priority of preference in the available scanning element; and the manager for scan chains determines whether the scan chain has undergone full distribution. If not, it will distribute the available scanning element to the scan chain, and the manager for the scanning elements will remove the available scanning element from the set of available scanning elements; otherwise, the constructor of the first preference sequence will check whether the scan chain possesses one scanning element with a preference priority lower than that of the available scanning element. When the scan chain possesses a scanning element with a preference priority lower than that of the available scanning element, the manager for the scan chains removes the scanning element with the lowest preference priority from the scan chain, and the manager for the scanning elements adds it to the set of the available scanning elements; in the meantime, the manager for the scan chains distributes the available scanning element to the scan chain. When the scan chain does not possess a scanning element with a preference priority lower than that of the available scanning element, the constructor of the second preference sequence selects one scan chain of the scanning element with a preference priority lower than that of the scan chain, so that the available scanning element can be redistributed. The manager for the scanning elements, after executing a successful distribution of the available scanning element, checks whether there are any other available scanning elements. If there are not, the reconstruction of a certain number of scan chains ends; otherwise, the selector again selects one available scanning element for distribution.

In another embodiment, the two-way distributor further involves one selector, one manager for scanning elements, and one manager for scan chains; the selector selects one scan chain to be reconstructed from the set of to-be-reconstructed scan chains in the manager for the scan chains; the constructor of the first preference sequence locates the scanning element with the top priority of preference in the scan chain to be reconstructed; and the manager for the scanning elements checks whether a scanning element is available or not; if it is, the manager for the scan chains distributes the scanning element to the scan chain, and the manager for the scanning elements removes it; otherwise, the constructor of the second preference sequence checks whether the scan chain where the scanning element is located possesses a preference priority higher than that of the scan chain to be reconstructed. The manager for the scan chains, when the scan chain where the scanning element is located possesses a lower priority of preference, removes the scanning element from the scan chain and distributes it to the scan chain to be reconstructed, and adds the original scan chain into the set of the to-be-reconstructed scan chains. The constructor of the first preference sequence, when the scan chain where the scanning element is located possesses a higher priority of preference, locates one scanning element with a preference priority lower than that of the scanning element, and again tries to reconfigure the scan chain to be reconstructed. The manager for the scan chains, after distributing the scanning element to the scan chain to be reconstructed, further determines whether the reconstruction has been completed or not. If it has, the manager checks whether there is a scan chain to be reconstructed; otherwise, the selector continues to select one scanning element for the scan chain to be reconstructed. When the manager for the scan chains finds no scan chain to be reconstructed, the reconstruction for all scan chains ends; otherwise, the selector continues to select one to-be-reconstructed scan chain for reconstruction.

The structural reconstruction method and device of the invention, by means of the two-way selection between scan chains and scanning elements, optimize the structure of scan chains in the overall design of chips and dramatically cut down the demand for wiring resources. They improve not only the testing quality but also the overall wiring rates of chips.

DESCRIPTION OF THE DRAWINGS

The various features, advantages and other uses of the present apparatus will become more apparent by referring to the following detailed description and drawing in which.

DETAILED DESCRIPTION

In order to facilitate a better understanding of the spirit of this invention, a detail description is provided for optimized embodiments of this invention.

This invention involves a structural reconstruction method and device for scan chains based on two-way selection between scan chains and scanning elements, which plays a significant role in scan chain structure—DFT (Design for Test) MAX of New Data Compression. The structure of a so-called DFT MAX scan chain, by means of data compression of on-chip scanning, can significantly reduce the testing time and testing data required for high-quality production and testing and has been increasingly adopted by industry.

The structural optimization for scan chains in this invention can be divided into two steps: the first one is the reconstruction process of all scan chains, that is, to redistribute the scanning elements in the same clock domain to the scan chains in the clock domain, and in the meantime guarantee that the timing length of the scan in each scan chain does not change; then, to individually optimize the structure of each scan chain after the reconstruction occurs.

The structural reconstruction of all scan chains in Step One is an issue of non-deterministic polynomial time, which is described below: in the logic design phase of chips, a certain number of scan chains and scanning elements are generated in the same clock domain; the timing length of scanning for each of the scan chains is fixed, and the starting and final positions of each scan chain are fixed; the position of each scanning element is fixed. In physical design of the chips, attempts are made through optimization to redistribute certain scanning elements in a certain number of scanning chains, so that the length of each scan chain can be minimized under the condition that the timing length of the scan in each scan chain is guaranteed to be constant.

Figure 1:
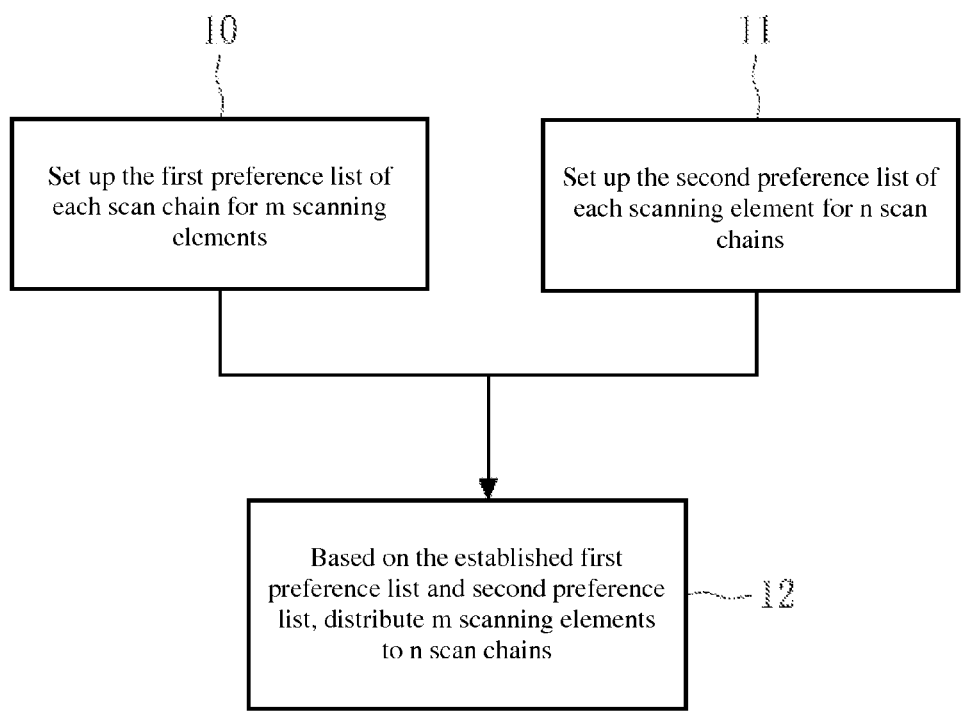
FIG. 1 is a flow chart of this invention in which all scanning elements are redistributed to all scan chains for the reconstruction of scan chains.

For Step One, this invention as shown in FIG. 1 provides a structural reconstruction method for scan chains based on two-way selection between scan chains and scanning elements:

Step 10, based on each of n scan chains from C1 to Cn, first preference lists from CL1 to CLn for m scanning elements from S1 to Sm (with both n and m greater than 1) are established. Each of the first preference lists from CL1 to C1$n$ is set up in accordance with the distance from each of scanning elements from S1 . . . Sm to the starting and ending points of correspondent scan chains from C1 to Cn, and an arrangement in an order from small to large. For instance, the first preference list CL1 is set up with the sum of distances from each of scanning elements S1 . . . Sm to the starting and ending points of the scan chain C1, and is ranged in an order from small to large.

Step 11, based on each of scanning elements from S1 to Sm, sets up second preference lists from SL1 to SLn for n scan chains from C1 to Cn. Among all lists, the second preference lists from SL1 to SLn are set up in accordance with the sum of the distances from correspondent scanning elements from S1 to Sm to the starting and ending points of scan chains from C1 to Cn plus the distances between the starting and ending points of the correspondent scan chains, and are arranged in an order from small to large.

Then, in Step 12, based on the first preference lists from C11 to CLn and the second preference lists from SL1 to SLn, m scanning elements from Si to Sm are distributed to n scan chains from C1 to Cn in accordance with the mode of two-way selection.

Figure 2:
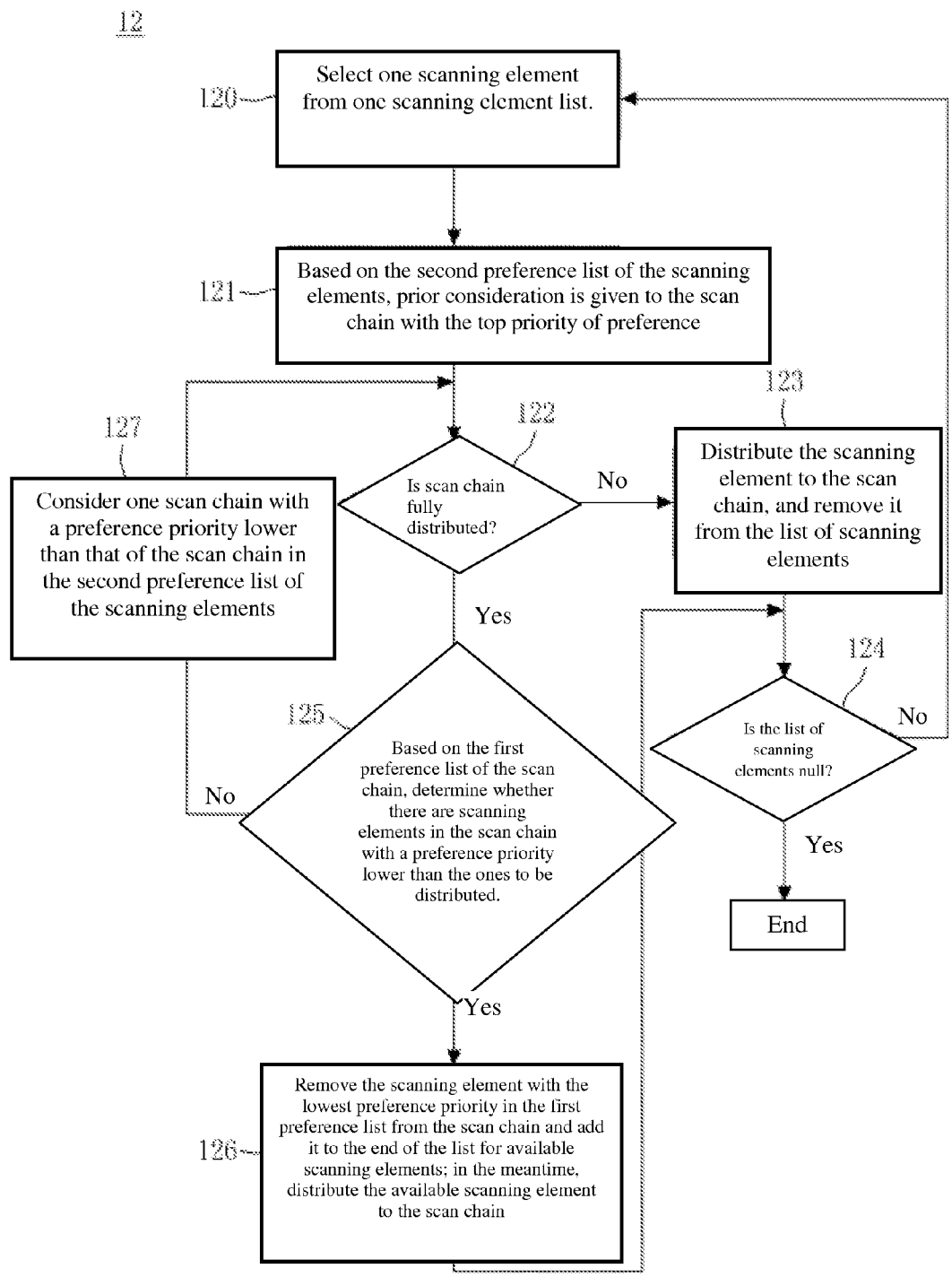
FIG. 2 is a flow chart in one embodiment of this invention in which according to the first and second preference lists, scanning elements are distributed to all scan chains via two-way selection.

As shown in FIG. 2, in accordance with one optimized embodiment of this invention, Step 12 specifically includes the following steps.

First, Step 120 selects one available scanning element from one list of available scanning elements S{S1 S2 . . . Sn}, such as S1. In Step 121, in accordance with the second preference list SL1 of the available scanning element S1 for n scan chains from C1 to Cn, a prior consideration is given to the scan chain with the top preference priority in the second preference list SLm, such as C1.

Then, in Step 122, whether scan chain C1 of the top preference priority has undergone full distribution or not is determined. If scan chain C1 hasn't undergo full distribution, the process goes to Step 123 in which the available scanning element S1 is distributed to scan chain C1 and is removed from the list of available scanning elements S. Then, Step 124 checks whether the list of the available scanning elements S is null or not; if yes, the reconstruction of the scan chains ends; otherwise, the process returns to Step 120. If the scanning chain C1 has undergone full distribution, the process goes to Step 125, wherein the first preference list CL1 of C1 is considered for scanning elements from S1 to Sm, and whether among the scanning elements in scanning chain C1 a scanning element exists with a preference priority lower than that of the available scanning element S1, such as S2 or S3, is determined. If one exists, the process goes to Step 126, the scanning element with the lowest preference priority, say, S3, in the first preference list CL1 of the scan chain C1 is removed from the scan chain C1, and it is added to the end of the list of the available scanning elements S; in the meantime, the available scanning element S1 is distributed to the scan chain Cl; afterwards, the process goes to Step 124 and whether the list of available scanning elements S is null or not is checked: if it is, the reconstruction ends; otherwise, the process returns to Step 120. If a scanning element does not exist in the scan chain C1 with a preference priority lower than that of the available scanning element S1, the process goes to Step 127 and the scan chain, for example, C2, with a preference priority lower than that of the scan chain in the second preference list SL1 of the available scanning element S1 is considered; and the process goes to Step 122.

Persons skilled in the art should be aware that the structural reconstruction method for scan chains is based on two-way selection of scan chains and scanning element is not limited to the above-mentioned content. The steps for setting up the first and second preference lists are not constrained by the order. The first preference for scanning elements by scan chains and the second preference for scan chains by scanning elements are not limited to the forms of lists, but can be in the form of other sequences that demonstrate an order. Similarly, the scanning elements and the scan chains to be reconstructed are not limited to the forms of lists and may be in a set form of another display status. And the subsequent two-way selection between the scan chains and scanning elements is also not limited the above steps.

Figure 3:
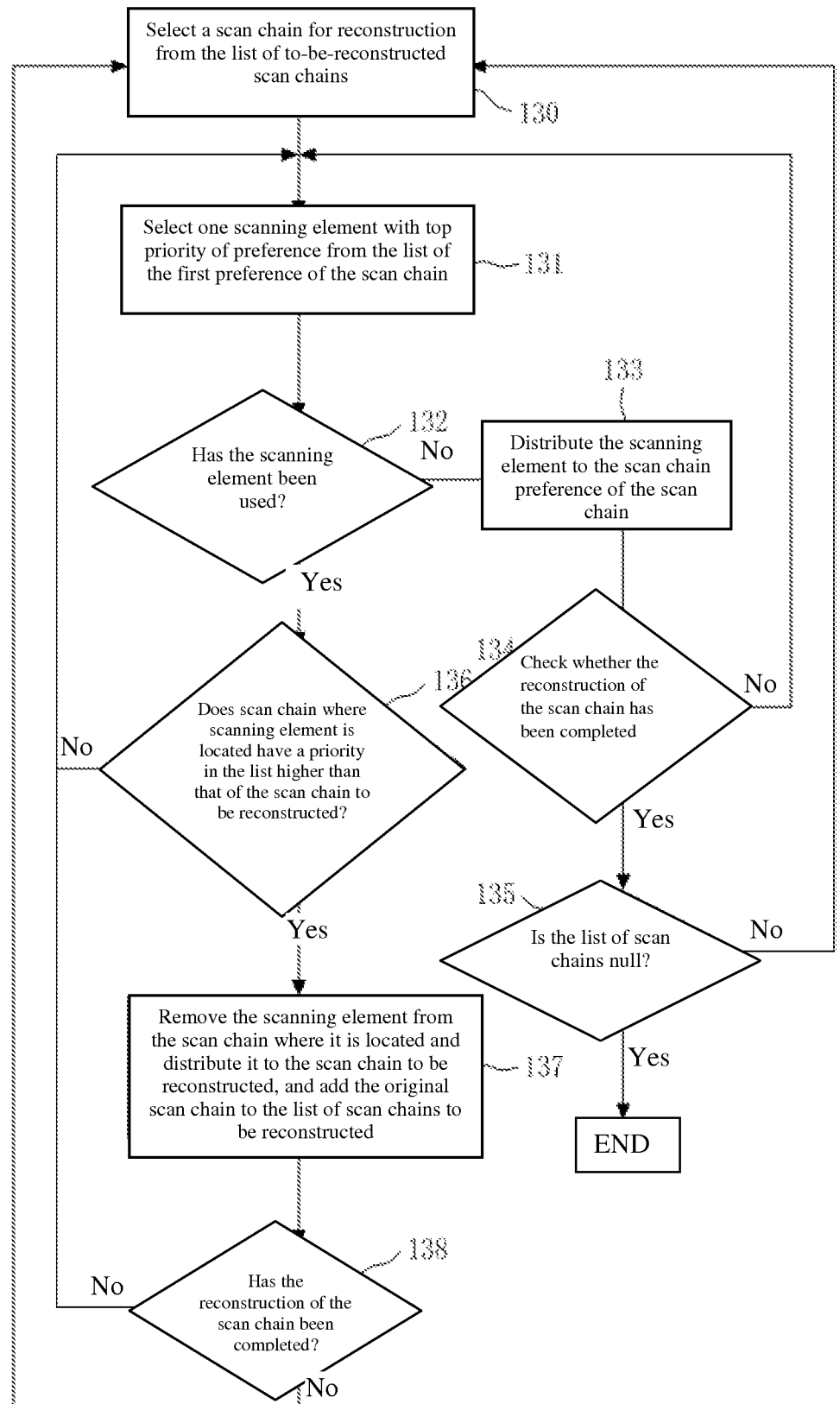
FIG. 3 is the flow chart in one embodiment of this invention in which according to the first and second preference lists, scanning elements are distributed to all scan chains via two-way selection.

For example, FIG. 3 describes an embodiment of this invention of another two-way selection in Step 13. Step 130 selects a scan chain to be reconstructed from a list of to-be-reconstructed scan chains. Then, Step 131 selects one scanning element with the top priority of preference from the first preference list of the scan chain. Step 132, based on a list of the available scanning elements and checks whether the scanning element has been used or not: if not, the process goes to Step 133, and the scanning element is distributed to the scan chain and is removed from the list of the available scanning elements; then, the process goes to Step 134 and whether the scan chain has completed the reconstruction, that is, has acquired a sufficient quantity of scanning elements, is checked. If the reconstruction is complete, the process goes to Step 135 and whether there is a scan chain to be reconstructed is checked. If there is, the process returns to and proceeds with Step 130; otherwise, the reconstruction of all scan chains ends. If Step 132 checks and finds that the scanning element has been used, the process goes to Step 136 and based on the second preference list of the scanning element, whether the scan chain where it is located possesses a preference priority higher than that of the scan chain to be reconstructed is determined: if the scan chain possesses a higher preference priority, the scan chain to be reconstructed, based on its first preference list, needs to reselect a scanning element with a preference priority lower than that of the scanning element, that is, to return to Step 131; otherwise, the process goes to Step 137, and the scanning element is removed from the scan chain in which it is located, it is distributed to the scan chain to be reconstructed, and the scan chain in which the scanning element was originally located is added to the list of to-be-reconstructed scan chains, so that the necessary, follow-up scanning elements may be selected for it to complete the reconstruction. Then, the process moves from Step 137 to Step 138, and whether the scan chain has completed the reconstruction or not is determined. If it has, the process returns to Step 130 and the selection of other scan chains continues; otherwise, the process returns to Step 131 and the selection of scanning elements for it continues.

Figure 4:
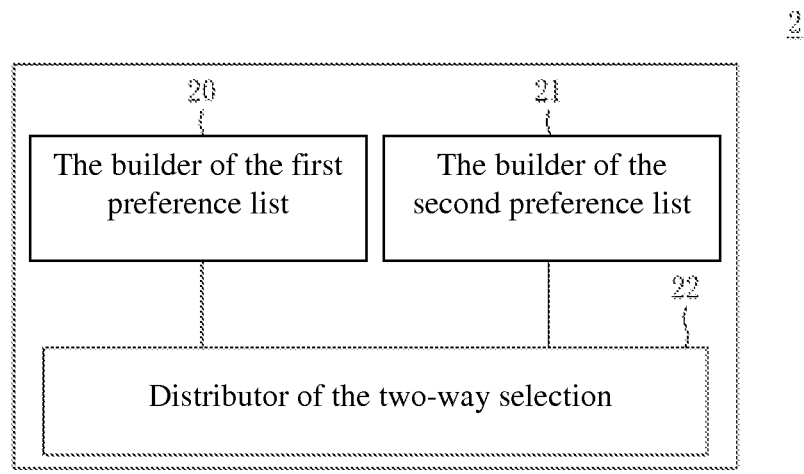
FIG. 4 is a schematic drawing of one embodiment of this invention that involves the structural reconstruction device for scan chains.

As shown in FIG. 4, this invention also provides structural reconstruction device 2 for scan chains based on the two-way selection between scan chains and scanning elements, containing one constructor 20 of the first preference lists, one constructor 21 of the second preference lists, and one distributor 22 of the two-way selection; the distributor 22 of the two-way selection has communication linkage with first preference list constructor 20 and with second preference list constructor 21. The constructor 20 of the first preference lists, based on each of n scan chains from C1 to Cn, sets up and stores the first preference lists from CL1 to CLn for m scanning elements from Si to Sm (both n and m greater than 1). The second preference list constructor 21, based on each of scanning elements from Si to Sm, sets up and stores the second preference lists from SL1 to SLn for n scan chains from C1 to Cn. The distributor 22 of the two-way selection can communicate with the constructors 21 and 22, and based on established first preference lists from CL1 to CLn and second preference lists from SL1 to SLn, distributes m scanning elements from S1 to Sm to n scan chains from C1 to Cn by means of two-way selection.

Figure 5:
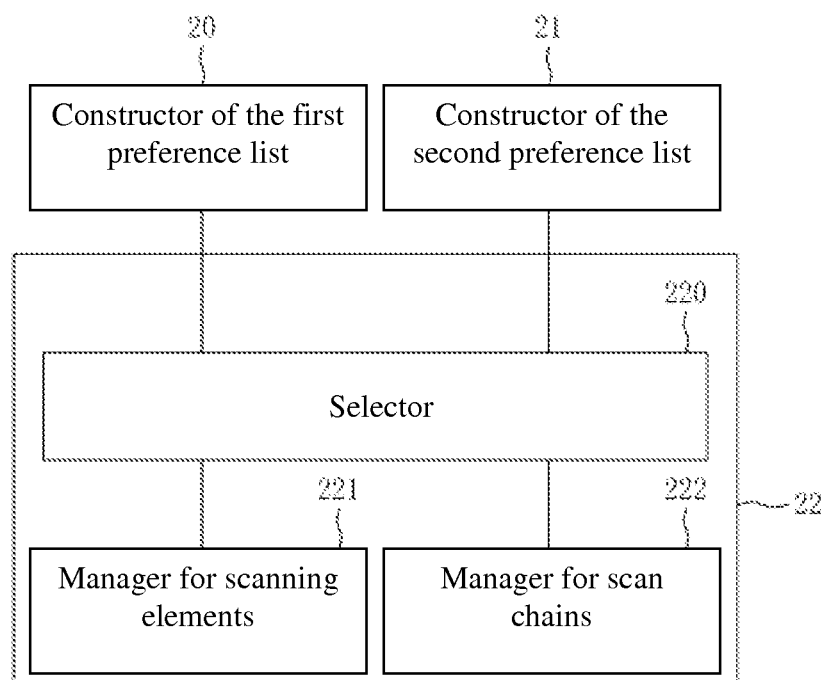
FIG. 5 is a schematic drawing of the two-way selection distributor in one embodiment of this invention that involves the structural reconstruction device for scan chains.

As shown in FIG. 5, based on one optimized embodiment of the invention, the distributor 22 of the two-way selection specifically contains one selector 220, one manager 221 for scanning elements and one manager 222 for scan chains; the selector 220 has a certain number of ports, through selector 220 the distributor 22 of two-way selection maintains its communication linkage with the constructor 20 of the first preference lists and with the constructor 21 of the second preference lists, and through which the selector 220 maintains its communication linkage with the manager 221 for scanning elements and with the manager 222 for scan chains.

First, the selector 220 makes a request to manager 221 for the scanning elements to check whether there are available scanning elements in the available scanning element list S{S1 S2 . . . Sn}. If yes, one available scanning element is selected from the list, for example, S1. Then, the selector 220 demands the constructor 21 of the second preference lists to locate the scan chain with the top priority of preference, for example, C1, based on the second preference list SL1 of the available scanning element S1 for n scan chains from C1 to Cn. The selector 220 receives the information from the constructor 21 of the second preference lists, and informs the manager 222 for scan chains of the distribution result.

The manager 222 for scan chains checks whether the scan chain C1 with the top priority of preference has undergone full distribution. If the scan chain C1 has not undergone full distribution, it distributes the available scanning element S1 to the scan chain C1, and informs the selector 220 of the successful distribution. The selector 220 tells the manager 221 for the scanning elements to remove the scanning element S1 from the list S of available scanning elements and update the distribution information of the scanning element, and then begins to select new available scanning elements. If the scan chain C1 has undergone full distribution, the manager 222 for the scan chains notifies the selector 220 of the fullness of the scan chain C1 as well as of information about the existing scanning elements of the scan chain Cl. The selector 220 turns to ask the constructor 20 of the first preference lists, based on the first preference list CL1 of the scan chain C1 for the scanning elements from S1 to Sm, to check whether scanning elements with a preference priority lower than that of the available scanning element S1 exist among the scanning elements in the scan chain C1. If the constructor 20 of the first preference lists finds that there are, for example, scanning elements S2 and S3, it finds the scanning element with the lowest preference priority in the first preference list CL1 of the scan chain C1, for example S3. The selector 220, after receiving the return information from the constructor 20 of the first preference lists, notifies the manager 221 for scanning elements to add it to the end of the list of the available scanning elements, to delete the available scanning element S1 from the list of available scanning elements, and to update the distribution information of these two scanning elements; tells the manager 222 for the scan chains to distribute the available scanning element S1 to the scan chain Cl; and then begins to select new available scanning elements for distribution. If the constructor 20 of the first preference lists finds no scanning elements with a preference priority lower than that of the available scanning element, then, the selector 220 asks the constructor 21 of the second preference lists to provide and select the scan chain, for example, C2, with a preference priority lower than that of the scan chain C1 from the second preference list SL1 of the available scanning element S1. The structural reconstruction device 2 for the scan chains, based on the scan chain C2, conducts a series of operations, including checking whether the scan chain C2 has undergone full distribution.

In accordance with another embodiment of this invention, the distributor 22 of the two-way selection may adopt different modes in distributing scanning elements and scan chains. The selector 220 first visits the manager 222 for scan chains and select one scan chain to be reconstructed from the preceding list of to-be-configured scan chains. Then, the selector 220 makes an inquiry to the constructor 20 of the first preference lists, and the latter, based on the first preference list of the scan chains, the constructor 20 of the first preference lists determines the scanning element with the top priority of preference. The selector 220, after receiving the information, turns to inform the manager 221 for the scanning elements. The manager 221 for the scanning elements checks whether the scanning element has been used:

If not used, the selector 220 notifies the manager 222 for scan chains to distribute the scanning element to the scan chain, and sends the request to manager 222 to examine whether the scan chain has completed the reconstruction, that is, the acquisition of sufficient scanning elements as needed. The selector 220 also tells the manager 221 for the scanning elements to delete the scanning element form the list of available scanning elements and update the distribution information. If the manager 222 for the scan chains checks and determines that the scan chain has completed the reconstruction, the selector 220 asks it to confirm whether there are other scan chains to be reconstructed; if there are, the selection of new scan chains for reconstruction continues; otherwise, the reconstruction of all scan chains ends.

If the manager 221 for the scanning elements finds that the scanning element has been used, the selector 220, after receiving the information, will ask the constructor 21 of the second preference lists to discriminate whether the scan chain where it is located possesses a preference priority higher than that of the scan chain to be reconstructed. If the scan chain has a higher preference priority, the selector 220 needs to re-request that the constructor 20 of the first preference lists, based on its first preference list, to identify the scanning element with a lower preference priority, namely, to begin to conduct a series of above-mentioned operations for the newly selected scanning element. Otherwise, the selector 220 tells the manager 222 for the scan chains to remove the scanning element from its scan chain and then distribute it to the scan chain to be reconstructed, and add the scan chain where the scanning element was originally located to the list of to-bereconstructed scan chains, so that the necessary, follow-up scanning elements may be selected. The selector 220 also tells the manager 221 for the scanning elements to update the distribution information of the scanning element, and asks the manager 222 for the scan chains to discriminate whether the scan chain has completed the reconstruction. If it has, the selector 220 begins to select other scan chains for reconstruction; otherwise, the selector 220 continues to select other scanning elements needed by the scan chain.

Figure 6:
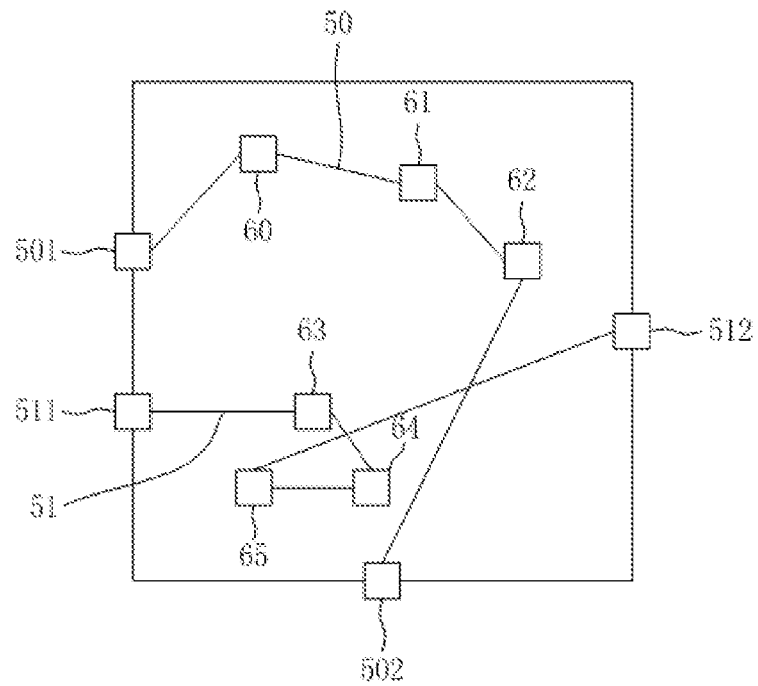
FIG. 6 is a schematic drawing of a pre-reconstructed scan chain in one embodiment of this invention.

As shown in FIG. 6, one embodiment of the invention involves the device 2 for the structural reconstruction of scan chains in the physical design phase of chips. Scan chains 50 and 51 generated in the logic design phase of the reconstruction, these scan chains 50 and 51 contain certain scanning elements 60, 61, 62, 63, 64 and 65 with the length of time sequence being 1. The first scan chain 50 contains three scanning elements, namely, 60, 61, and 62. The second scan chain 51 contains three scanning elements, namely, 63, 64, and 65. The structure of the scan chain 50 is {60 61 62} (irrespective of the starting point of 501 and the end point of 502, similar for the following). The structure of the second scan chain 51 is {63 64 65}. This means that each of the two scan chains 50 and 51 after reconstruction shall contain three scanning elements in order to maintain the same timing length.

The constructor 20 of the first preference lists respectively sets up and stores the first preference lists 500 and 510 of the two scan chains 50 and 51 for six scanning elements 60, 61, 62, 63, 64 and 65. The constructor 21 of the second preference lists respectively sets up and stores the second preference lists 600, 610, 620, 630, 640 and 650 of the six scanning elements 60, 61, 62, 63, 64 and 65 for the two scan chains 50 and 51.

Figure 7:
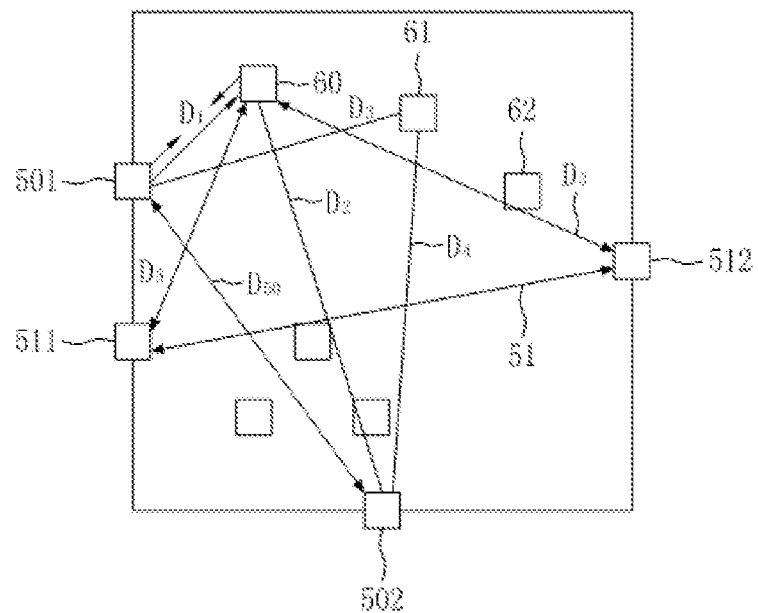
FIG. 7 is a schematic drawing of one embodiment of this invention in which the first and second preference sequences are set up.

Specifically speaking, the constructor 20 of the first preference lists respectively sets up and stores the first preference lists 500 and 510 of the two scan chains 50 and 51 for six scanning elements 60, 61, 62, 63, 64 and 65. Taking the preference sequence of the scan chain 50 for two scanning elements 60 and 61 for example, as shown in FIG. 7, the constructor 20 of the first preference lists computes the distance from the scanning element 60 to the starting point 501 of the scan chain 50 as D1, and the distance to the end point 502 of the scan chain 50 as D2 and computes the distance from the scanning element 61 to the starting point 501 of the scan chain 50 as D3, and the distance to the end point 502 of the scan chain 50 as D4. According to the computation, the result is as follows: D1+D2<D3+D4. Therefore, the preference ordering of the scan chain 50 for these two scanning elements 60 and 61 is that the scanning element 60 is superior to the scanning element 61. That is to say, in the first preference list 500 of the scan chain 50, the scanning element 60 is arranged prior to the scanning element 61. Based on the above method, the constructor 20 of the first preference lists finally acquires and stores the first preference lists 500 and 510 of the two scan chains 50 and 51 for the six scanning elements. The lists are as follows:

The first preference list 500 of the scan chain 50: {65 64 63 60 61 62}

The first preference list 510 of the scan chain 51: 163 65 64 62 61 601

The constructor 21 of the second preference lists respectively sets up and stores the second preference lists 600, 610, 620, 630, 640 and 650 of six scanning elements 60, 61, 62, 63, 64 and 65 for the two scan chains 50 and 51. As shown in FIG. 7, taking for example the scanning element 60, as mentioned earlier, the constructor 21 of the second preference lists computes the distance D1 from the scanning element 60 to the starting point 501 of the scan chain 50, and the distance D2 to the end point 502 of the scan chain 50, and there is the distance D50 from the starting point 501 to the end point 502 of scan chain 50; and computes the distance D5 from the scanning element 60 to the starting point 510 of the scan chain 51, and the distance D6 to the end point 511 of the scan chain 51, and there is the distance D51 from the starting point 510 to the end point 511 of the scan chain 51According to the computation, the result is as follows: D1+D2+D50<D5+D6+D51. Therefore, the preference ordering of the scanning element 60 for these two scan chains 50 and 51 is that the scanning element 60 possesses a preference priority for the scan chain 50 that is higher than that for the scan chain 51. That is to say, in the second preference list 600 of the scanning element 60, the scan chain 50 is arranged prior to the scan chain 51. Based on the method above, the constructor 21 of the second preference lists finally acquires and stores the second preference lists 600, 610, 620, 630, 640 and 650 of six scanning elements 60, 61, 62, 63, 64 and 65 for the two scan chains 50 and 51.

The second preference list 600 of the scanning element 60: {50 51}

The second preference list 610 of the scanning element 61: {51 50}

The second preference list 620 of the scanning element 62: {51 50}

The second preference list 630 of the scanning element 63: {50 51}

The second preference list 640 of the scanning element 64: {50 51}

The second preference list 650 of the scanning element 65: {50 51}

Then, based on the above first preference lists 500 and 510 and the second preference lists 600, 610, 620, 630, 640 and 650, the two-way selection distributor 22 conducts the structure reconstruction of the scan chains for two-way selection between two scan chains 50 and scanning elements 60, 61, 62, 63, 64 and 65, and appropriate scanning elements are selected and distributed to scan chains 50 and 51. Specifically:

The selector 220 queries the manager 221 for scanning elements, from which the available scanning list 6 can be used to choose an available scanning element 60. Furthermore, the selector 220 makes a request to constructor 21 of the second preference lists to locate the scan chain 50 with the top priority of preference, based on the second preference list 600 of the available scanning element 60 for the scan chains 50 and 51. The selector 220 receives the information from the constructor 21 of the second preference lists, and informs the manager 222 for scan chains of the distribution result. The manager 222 for the scan chains, after checking and determining that the scan chain 50 has not undergone full distribution, distributes the available scanning element 60 to the scan chain 50 and informs the selector 220 of a successful distribution. The selector 420 tells the manager 221 for the scanning elements to remove the scanning element 60 from the list 6 of available scanning elements and to update the distribution information of the scanning element 60. That is, the structure of the scan chain 50 at this time is {60}, and the structure of the scan chain 51 is null, and scanning elements 61, 62, 63, 64 and 65 are available scanning elements.

Then, the selector 220 continues to visit the list 6 of available scanning elements in the manager 221 for the scanning elements and selects the scanning element 61. As above, after the selector 220 queries the constructor 21 of the second preference and the manager 222 for scan chains makes the discrimination, the scanning element 61 is distributed to the scan chain 51, and the manager 221 for the scanning elements removes it from the list 6 of available scanning elements. That is, the structure of the scan chain 50 at this time is {60}, and the structure of the scan chain 51 is {61}, and scanning elements 62, 63, 64 and 65 are available scanning elements.

Through repeated operations, the device 2 for the structural reconstruction of scan chains distributes scanning elements 62, 63 and 64 to the two scan chains 51, 50 and 50 [sic; 51 and 50] At this time, the two scan chains are {60 63 64} and {61 62}, and the available scanning element is scanning element 65.

In distributing the scanning element 65, the constructor 21 of the second preference lists is queried based on the selector 220, and the priority judgment for the scan chain 50 is acquired. When the manager 222 for scan chains receives the distribution information from the selector 220, the query shows that the scan chain 50 is now full; the manager for scan chains notifies the selector 220 of the information that scan chain 50 is now full and of the scan chain 50 currently using the scanning elements 60, 63 and 64. The selector 220 asks the constructor 20 of the first preference lists to provide the status of the preference priority of scanning elements 60, 63 and 64 used by the scan chain 50 and the available scanning element 65 in the first preference list 500 of the scan chain 50. The constructor 20 of the first preference lists determines that existing scanning elements 60, 63 and 64 in the scan chain 50 have a preference priority lower than that of the available scanning element 65, wherein the scanning element 60 has the lowest preference priority. Thus, the selector 220 tells the manager 222 for scan chains to remove the scanning element 60 from the scan chain 50, and to distribute the available scanning element 65 to the scan chain 50; and the selector tells the manager 221 for scanning elements to add the scanning element 60 to the end of the list 6 of available scanning elements. That is, the scan chain 50 at this time is {65 63 64}, and the scan chain 51 is {61 62}, and the list 6 of available scanning elements is {60}.

Then, the selector 220 selects the scanning element 60, and with a query, the scan chain with the top priority of preference in the constructor 21 of the second preference lists is the scan chain 50. The manager 222 for scan chains discovers that the scan chain 50 has undergone full distribution, and notifies the selector 220 of the information and of the scanning elements 65, 63 and 64 in the scan chain 50. After querying the constructor 20 of the first preference lists, the selector 220 finds that the scanning elements 65, 63 and 64 in the scan chain 50 all have a preference priority higher than that of the available scanning element 60, and then queries the constructor 21 of the second preference lists and determines in the second preference list 600 the scan chain 51 that possesses an inferior preference priority. The manager 222 for scan chains, after receiving the information from the selector 220, determines that the scan chain 51 has not undergone full distribution, so it distributes the scanning element 60 to the scan chain 51 and notifies the selector 220 of a successful distribution. The selector 220 asks the manager 221 for scanning elements to remove the scanning element 60 from the list 6 of available scanning elements. Now, the scan chain 50 contains scanning elements 65, 63 and 64, and the scan chain 51 contains scanning elements 61, 62 and 60, and the list 6 of available scanning elements is null; the reconstruction for all scan chains ends.

Figure 8:
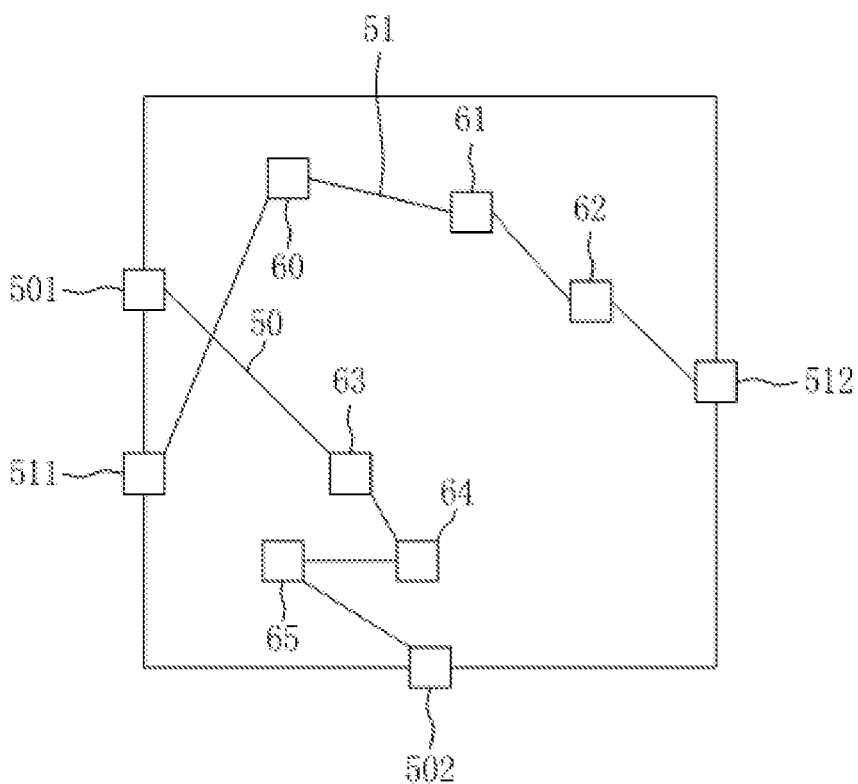
FIG. 8 is a schematic drawing of one embodiment of this invention that demonstrates a reconstructed and individually optimized scan chain.

After these scanning elements are re-distributed to the scan chains, an optimized ordering of these scanning elements can be executed inside the scan chains. Persons skilled in the art should be aware that there are many arrangement optimization options for the scanning elements inside one single scan chain, concerning which this invention will not describe here. An optimization method can be used, for example, in which the starting point of the scan chain is made in a simple way the initial reference position, and the scanning element at the shortest distance is selected successively. The above embodiments, after being optimized, obtain two scan chains 50 and 51 as shown in FIG. 8. A comparison with FIG. 6 shows that the overall length of the optimized scan chains has been significantly reduced and is much shorter than that before the optimization.

The structural reconstruction method and apparatus for scan chains in this invention, in which the relocation of the scanning elements to each of the scan chains simply through two-way selection of scan chains and scanning elements on a global scale with one-way selection of the scanning device by the scan chain, consequently optimizes the structures of scan chains in the whole chip design, and greatly lowers the demand for wiring resources. The overall wiring rates of chips are improved while the testing performance is raised.

A technical description and characteristics of the invention have been disclosed as above. However, persons skilled in the art are still likely to make various substitutions and modifications without departing from the spirit of the invention on the basis of the instructions and disclosures of the invention. Therefore, the extent of protection of the invention is not to be limited to the content revealed by the embodiments, but rather includes all sorts of substitutions and modifications without departing from the spirit of the invention and while covered by the claims in the patent application.

The invention claimed is:

1. A structural reconstruction method for reconstructing a plurality of scan chains, the method comprising:
   setting up a first preference sequence for a plurality of scanning elements in each of the plurality of scan chains respectively;
   setting up a secondary preference sequence for the plurality of scan chains in each of the plurality of scanning elements respectively; and
   executing, using a computer, two-way selection between the plurality of scan chains and the plurality of scanning elements based on the corresponding first preference sequence and the second preference sequence, at least some of the plurality of scanning elements redistributable to the plurality of scan chains, the two-way selection further comprising:
   selecting an available scanning element from a set of available scanning elements;
   locating, from the plurality of scan chains, a scan chain with a top priority of preference based on the second preference sequence of the available scanning element;
   determining whether the scan chain has undergone full distribution;
   distributing the available scanning element to the scan chain and removing it from the set of the available scanning elements in response to a determination that the scan chain has not undergone full distribution; and
   determining whether there is a scanning element in the scan chain with a preference priority lower than the available scanning element in response to a determination that the scan chain has undergone full distribution.

2. The structural reconstruction method as described in claim 1, wherein setting up the first preference sequence for each of the plurality of scan chains comprises:
   summing distances from each of the plurality of scanning elements to starting points and ending points of the corresponding scan chain; and
   arranging in an order from small to large.

3. The structural reconstruction method as described in claim 1, wherein setting up the second preference sequence for each of the plurality of scanning elements comprises:
summing distances from the scanning element to each starting point and ending point of the plurality of scan chains with distances between a starting point and an end point of the corresponding scan chain; and
arranging in an order from small to large.

4. The structural reconstruction method as described in claim 1, further comprising:
removing from the scan chain the scanning element with a lowest preference priority if there is the scanning element in the scan chain with the preference priority lower than the available scanning element;
adding the removed scanning element into the available scanning elements; and
distributing the available scanning element to the scan chain.

5. The structural reconstruction method described in claim 4, wherein determining if the scan chain has undergone full distribution further comprises:
ending reconstruction of a certain number of scan chains if the available scanning elements are null; and
re-selecting the available scanning element if the available scanning elements are not null.

6. The structural reconstruction method described in claim 1 further comprising:
based on the second preference sequence of the available scanning element, selecting a scan chain with a preference priority inferior to a preference priority of the available scan chain if there is not the scanning element in the scan chain with the preference priority lower than the available scanning element; and
re-determining if the scan chain has undergone full distribution.

7. A structural reconstruction method for reconstructing a plurality of scan chains, the method comprising:
setting up a first preference sequence for a plurality of scanning elements in each of the plurality of scan chains respectively;
setting up a second preference sequence for the plurality of scan chains in each of the plurality of scanning elements respectively;
executing, using a computer, two-way selection between the plurality of scan chains and the plurality of scanning elements based on the corresponding first preference sequence and the second preference sequence, at least some of the plurality of scanning elements redistributable to the plurality of scan chains, the two-way selection further comprising:
selecting one scan chain to be reconstructed in the plurality of scan chains;
selecting one scanning element with a top priority of preference based on the first preference sequence of the scan chain to be reconstructed;
determining if the scanning element has been used;
distributing the scanning element to the scan chain and removing it from one set of available scanning elements if the scanning element has not been used; and
checking whether the scan chain where the scanning element is located possesses a preference priority higher than that of the scan chain to be reconstructed, based on the second preference sequence of the scanning element, if the scanning element has been used.

8. The structural reconstruction method as described in claim 7 further comprising:
removing the scanning element from the scan chain where it is located and distributing the scanning element to the scan chain to be reconstructed and adding the original scan chain into the set of the to-be-reconstructed scan chains if the scan chain where the scanning element is located has a lower priority level of preference; and
based on the first preference sequence of the scan chain to be reconstructed, locating one scanning element with a preference priority lower than that of the scanning element and re-determining if the scanning element has been used if the scan chain where the scanning element is located possesses a higher priority of preference.

9. The structural reconstruction method as described in claim 7, wherein determining if the scanning element has been used further comprises:
checking if the scan chains to be reconstructed are null if the reconstruction of the scan chain has been completed; and
reselecting one scanning element if the reconstruction of the scan chain has not been completed.

10. The structural reconstruction method as described in claim 9 further comprising: ending the reconstruction of all scan chains if the scan chains to be reconstructed are null; and
reselecting one scan chain to be reconstructed if the scan chains to be reconstructed are not null.

11. A structural reconstruction device for reconstructing scan chains comprising:
a constructor of a first preference sequence configured to respectively set up the first preference sequence of certain scanning elements for each of the scan chains;
a constructor of a second preference sequence configured to respectively set up the second preference sequence of scanning elements for each of the scan chains; and
a two-way selection distributor configured for two-way selection between the scan chains and the scanning elements based on the corresponding first preference sequence and the second preference sequence, the scanning elements redistributable to the scan chains, the two-way selection distributor comprising:
one selector;
one manager for the scanning elements; and
one manager for the scan chains, wherein
the selector configured to select one available scanning element from available scanning elements in the manager for scanning elements;
the constructor of the second preference sequence configured to locate the scan chain with a top priority of preference in the available scanning element; and
the manager for scan chains configured to determine if the scan chain has undergone full distribution;
if the scan chain has not undergone full distribution, the manager for scan chains is further configured to distribute the available scanning element to the scan chain and the manager for the scanning elements is further configured to remove the available scanning element from the available scanning elements; and
if the scan chain has undergone full distribution, the constructor of the first preference sequence is configured to check if the scan chain possesses one scanning element with a preference priority lower than the preference priority of the available scanning element.

12. The structural reconstruction device as described in claim 11, wherein the constructor of the first preference sequence is further configured to sum distances from each of a number of scanning elements to starting points and ending points of the scan chain and arrange an order from small to large.

13. The structural reconstruction device as described in claim 11, wherein the constructor of the second preference sequence is further configured to sum distances from the scanning elements to each starting point and ending point of the scan chains and the distances between the starting points and the ending points of corresponding scan chains and arrange an order from small to large.

14. The structural reconstruction device as described in claim 11, wherein if a scan chain possesses a scanning element with a preference priority lower than that of the available scanning element, the manager for the scan chains is further configured to remove the scanning element with a lowest preference priority from the scan chain and to distribute the available scanning element to the scan chain, and the manager for the scanning elements is further configured to add the removed scanning element to the available scanning elements.

15. The structural reconstruction device as described in claim 14, wherein the manager for the scanning elements, after making a successful distribution of the available scanning element, is further configured to check for other available scanning elements and, if none, to end reconstruction of the number of scan chains; if so, the selector is further configured to reselect one available scanning element for distribution.

16. The structural reconstruction device as described in claim 11, wherein if a scan chain does not possess a scanning element with a preference priority lower than that of the available scanning element, the constructor of the second preference sequence is further configured to select one scan chain of the scanning element with a preference priority lower than that of the scan chain, the available scanning element being redistributable.

17. The structural reconstruction device as described in claim 11, wherein
if the scanning element is available, the manager for the scan chains is further configured to distribute the scanning element to the scan chain, and the manager for the scanning elements is further configured to remove the scanning element; and
if the scanning element is not available, the constructor of the second preference sequence is further configured to check the scan chain where the scanning element is located that possesses a preference priority higher than the preference priority of the scan chain to be reconstructed.

18. The structural reconstruction device as described in claim 17, wherein the manager for the scan chains, when the scan chain where the scanning element is located possesses a lower priority of preference, is further configured to remove the scanning element from the scan chain and distribute the removed scanning element to the scan chain to be reconstructed, and to add an original scan chain into to-be-reconstructed scan chains.

19. The structural reconstruction device as described in claim 18, wherein the manager for the scan chains, after distributing the scanning element to the scan chain to be reconstructed, is further configured to discriminate if the reconstruction is completed; if the reconstruction has been completed, the manager for the scan chains is further configured to check if there is a scan chain to be reconstructed; and if the reconstruction has not been completed, the selector is further configured to continue to select one scanning element for the scan chain to be reconstructed.

20. The structural reconstruction device as described in claim 19, wherein, if the manager for the scan chains finds no scan chain to be reconstructed, the reconstruction for all scan chains ends; and if the manager for the scan chains finds a scan chain to be reconstructed, the selector is further configured to continue to select one scan chain for reconstruction.

21. The structural reconstruction device as described in claim 17, wherein the constructor of the first preference sequence, when the scan chain where the scanning element is located possesses a higher priority of preference, is further configured to locate one scanning element with a preference priority lower than that of the scanning element, and to attempt to reconfigure the scan chain to be reconstructed.

22. A method for structural optimization for scan chains, the method comprising:
identifying a plurality of scanning elements in a same clock domain;
determining a first preference sequence and a second preference sequence for a plurality of scan chains;
redistributing the plurality of scanning elements identified to a first scan chain and a second scan chain within the clock domain; and
executing, using a computer, two-way selection based on the first preference sequence and the second preference sequence, wherein the two-way selection comprises:
selecting an available scanning element from a set of available scanning elements;
locating a scan chain with a top priority of preference based on the second preference sequence of the available scanning element;
determining whether the scan chain has undergone full distribution;
distributing the available scanning element to the scan chain and removing it from the set of the available scanning elements in response to a determination that the scan chain has not undergone full distribution; and
determining whether there is a scanning element in the scan chain with a preference priority lower than the available scanning element in response to a determination that the scan chain has undergone full distribution.

23. A method for structural optimization for scan chains, the method comprising:
identifying a plurality of scanning elements in a same clock domain;
determining a first preference sequence and a second preference sequence for a plurality of scan chains;
redistributing the plurality of scanning elements identified to a first scan chain and a second scan chain within the clock domain; and
executing, using a computer, two-way selection based on the first preference sequence and the second preference sequence, wherein the two-way selection comprises:
selecting one scan chain to be optimized in the plurality of scan chains;
selecting one scanning element with a top priority of preference based on the first preference sequence of the scan chain to be optimized;
determining if the scanning element has been used;
distributing the scanning element to the scan chain and removing the scanning element from the set of available scanning elements if the scanning element has not been used; and
checking whether the scan chain where the scanning element is located possesses a preference priority higher than that of the scan chain to be optimized, based on the second preference sequence of the scanning element, if the scanning element has been used.

* * * * *